United States Patent
Davies et al.

(10) Patent No.: US 10,746,922 B2
(45) Date of Patent: Aug. 18, 2020

(54) WAVEGUIDE STRUCTURE

(71) Applicant: Oclaro Technology Limited, Towcester, Northamptonshire (GB)

(72) Inventors: Samuel Davies, Northampton (GB); Mark Kearley, Northampton (GB); Selina Farwell, Towcester (GB)

(73) Assignee: Lumentum Technology UK Limited, Northamptonshire (GB)

( * ) Notice: Subject to any disclaimer, the term of this patent is extended or adjusted under 35 U.S.C. 154(b) by 0 days.

(21) Appl. No.: 16/328,654

(22) PCT Filed: Sep. 29, 2017

(86) PCT No.: PCT/GB2017/052931
§ 371 (c)(1),
(2) Date: Feb. 26, 2019

(87) PCT Pub. No.: WO2018/060729
PCT Pub. Date: Apr. 5, 2018

(65) Prior Publication Data
US 2019/0369328 A1 Dec. 5, 2019

(30) Foreign Application Priority Data
Sep. 29, 2016 (GB) .................................. 1616562.3

(51) Int. Cl.
*G02B 6/12* (2006.01)
*G02B 6/136* (2006.01)
(Continued)

(52) U.S. Cl.
CPC ......... *G02B 6/12002* (2013.01); *G02B 6/136* (2013.01); *H01S 5/026* (2013.01);
(Continued)

(58) Field of Classification Search
CPC .... H01S 5/02453; H01S 5/026; H01S 5/0612; H01S 5/06256; H01S 5/2222;
(Continued)

(56) References Cited

U.S. PATENT DOCUMENTS

2003/0025976 A1* 2/2003 Wipiejewski ........... G02F 1/011
359/240
2004/0240818 A1 12/2004 Laskowski et al.
(Continued)

FOREIGN PATENT DOCUMENTS

CN 101529312 A 9/2009
CN 103532009 A 1/2014
(Continued)

OTHER PUBLICATIONS

International Search Report and Written Opinion for Application No. PCT/GB2017/052931, dated Jan. 10, 2018, 15 pages.
(Continued)

*Primary Examiner* — Armando Rodriguez
(74) *Attorney, Agent, or Firm* — Harrity & Harrity, LLP

(57) ABSTRACT

A waveguide structure including a waveguide having a thermally controllable section, and a method of manufacturing the structure. The waveguide structure comprises a plurality of layers. The layers comprise, in order: a substrate (306), a sacrificial layer (305), a lower cladding layer (303), a waveguide core layer (302), and an upper cladding layer (301). The lower cladding layer, waveguide core layer, and upper cladding layer form the waveguide, the waveguide has a waveguide core. The waveguide structure has a continuous via (307) passing through the upper cladding layer, waveguide core layer, and lower cladding layer and running parallel to the waveguide ridge (304) along substantially the whole length of the thermally controllable section. The waveguide structure also has a thermally insulating region
(Continued)

(308) in the sacrificial layer extending at least from the via to beyond the waveguide ridge along the whole length of the thermally controllable section. The sacrificial layer comprises a sacrificial material outside of the thermally insulating region, and a thermally insulating gap (308) or thermally insulating material separating the lower cladding layer and substrate inside the thermally insulating region. The structure is manufactured by providing a wet etch to the sacrificial layer through the via in order to remove material from at least the thermally insulating region.

25 Claims, 5 Drawing Sheets

(51) Int. Cl.
  *H01S 5/024* (2006.01)
  *H01S 5/026* (2006.01)
  *H01S 5/06* (2006.01)
  *H01S 5/0625* (2006.01)
  *H01S 5/22* (2006.01)
  *H01S 5/227* (2006.01)
(52) U.S. Cl.
  CPC ........ *H01S 5/02453* (2013.01); *H01S 5/0612* (2013.01); *H01S 5/06256* (2013.01); *H01S 5/227* (2013.01); *H01S 5/2222* (2013.01); *G02B 2006/12035* (2013.01); *G02B 2006/12097* (2013.01); *G02B 2006/12107* (2013.01); *G02B 2006/12135* (2013.01)
(58) Field of Classification Search
  CPC ..... H01S 5/227; G02B 6/12002; G02B 6/136; G02B 2006/12035; G02B 2006/12097; G02B 2006/12107
  See application file for complete search history.

(56) References Cited

U.S. PATENT DOCUMENTS

| | | |
|---|---|---|
| 2007/0286552 A1 | 12/2007 | Aalto |
| 2009/0245296 A1 | 10/2009 | Santori et al. |
| 2009/0297092 A1 | 12/2009 | Takahashi |
| 2014/0321488 A1 | 10/2014 | Chen et al. |

FOREIGN PATENT DOCUMENTS

| | | |
|---|---|---|
| CN | 105409071 A | 3/2016 |
| JP | H01158413 A | 6/1989 |
| JP | H09211240 A | 8/1997 |
| JP | 2000 206476 A | 7/2000 |
| JP | 2000206476 A | 7/2000 |
| JP | 2004037524 A | 2/2004 |
| JP | 2006245344 A | 9/2006 |
| JP | 2014182185 A | 9/2014 |
| JP | 2015170750 A | 9/2015 |
| WO | 2008047634 A1 | 4/2008 |

OTHER PUBLICATIONS

GB Search Report Under Section 17(5), GB Application No. 1616562.3, dated Feb. 20, 2017, 3 pages.
GB Combined Search and Examination Report Under Sections 17 and 18(3), GB Application No. 1715826.2, 6 pages.
PCT International Search Report and Written Opinion, PCT Application No. PCT/GB2017/052931, dated Jan. 10, 2018, 20 pages.
PCT International Preliminary Report on Patentability, PCT Application No. PCT/GB2017/052931, dated Dec. 17, 2018, 18 pages.

* cited by examiner

WAVEGUIDE STRUCTURE

RELATED APPLICATIONS

This application is a 35 U.S.C. 371 national stage application of PCT Application No. PCT/GB2017/052931, filed Sep. 29, 2017, which claims priority to United Kingdom Patent Application No. 1616562.3, filed Sep. 29, 2016, which are incorporated by reference in their entireties.

FIELD OF THE INVENTION

The present invention relates to a waveguide structure. In particular, the present invention relates to an improved waveguide structure including a waveguide having a thermally controllable section, and a method for manufacturing it.

BACKGROUND

Where the term "light" is used, this refers generally to electromagnetic radiation, and not specifically to visible light. Where the term "laser" is used, this refers to a semiconductor laser unless specified otherwise.

Thermally tuned semiconductor lasers (e.g. distributed Bragg reflector, DBR, lasers) are being developed to improve linewidth performance, compared to known electronically tuned lasers. Each type of tuning acts by modifying the refractive index of one or more components of the laser such as a reflector, causing that component to select for a different wavelength.

Electronically tuned lasers provide high levels of optical loss, which increases the laser threshold current and degrades the linewidth. Furthermore, because electronic tuning has a very fast response (on the order of nanoseconds), electronics noise is easily coupled to the laser output.

In contrast, thermal tuning does not significantly increase optical loss, so there is negligible degradation of linewidth. Furthermore, since the response of thermal tuning is much slower (on the order of several tens of microseconds), the laser output is decoupled from high frequency noise sources. Heat is applied to the waveguide optical core via a resistive heater stripe running on top or closely parallel to the waveguide ridge. The stripe is electrically isolated from the ridge by a passivation dielectric.

A typical electrically tuned laser has a cross section as shown in FIG. 1A. The laser comprises a p-cladding 101, a waveguide core layer 102, an n-cladding layer 103 and a substrate 104. The p-cladding 101 is etched to form a waveguide ridge 105, to which is attached electrical means for varying the refractive index (not shown). The region of the waveguide core layer under the waveguide ridge forms the waveguide core.

FIG. 1B shows a "buried heterostructure" laser. The laser comprises a p-cladding 111, a waveguide core layer 112, an n-cladding layer 113 and a substrate 114. Instead of the waveguide ridge 115, the waveguide is formed by a structure 115 in the upper cladding layer and waveguide core layer, which is isolated by an isolating region 116. The waveguide core of the buried heterostructure laser is formed by the section of the waveguide core layer within the structure 115.

Each laser is a planar structure of well heat-sunk materials, designed to extract the heat generated by the diodes. However, this means that when adapting such a laser design for thermal tuning, the power required to cause the necessary temperature shifts is very large (e.g. 1W for a 50-70° C. temperature change). To improve the efficiency of thermal tuning, it is desirable to thermally isolate the waveguide from the support structures. However, sections of the laser which are not thermally tuned should be in thermal contact with the support structures so that their temperature can be held constant.

An example known structure for achieving this is shown for a ridge waveguide laser in FIGS. 2A and 2B, where FIG. 2A is a cross section view of the structure along the line IIA-IIA in FIG. 2B, and FIG. 2B is a plan view. The laser has an upper p-cladding layer 201, a waveguide core 202, and a lower n-cladding layer 203. The upper p-cladding layer is etched to form a waveguide ridge 204. A layer of sacrificial material 205 is located between the lower cladding layer and a substrate 206, and this sacrificial material is etched out by a wet etch process to leave an airgap 208 underneath the section containing the waveguide ridge. Vias 207 are provided in the upper cladding layer, waveguide core, and lower cladding layer to allow the wet etch to reach the sacrificial material. Clearly, if the vias completely surround the waveguide, then it would no longer be supported, so support structures 209 are provided in the vias to connect the waveguide to the rest of the substrate.

However, these support structures cause the waveguide to have uneven thermal characteristics—i.e. parts of the waveguide near a support structure will cool more readily than parts distant from a support structure. This uneven heating affects the uniform control of refractive index along the component and reduces the performance of the laser.

SUMMARY

According to a first aspect, there is provided a waveguide structure including a waveguide having a thermally controllable section. The waveguide structure comprises a plurality of layers. The layers comprise, in order: a substrate, a sacrificial layer, a lower cladding layer, a waveguide core layer, and an upper cladding layer. The lower cladding layer, waveguide core layer, and upper cladding layer form the waveguide, the waveguide has a waveguide core. The waveguide structure has a continuous via passing through the upper cladding layer, waveguide core layer, and lower cladding layer and running parallel to the waveguide ridge along substantially the whole length of the thermally controllable section. The waveguide structure also has a thermally insulating region in the sacrificial layer extending at least from the via to beyond the waveguide ridge along the whole length of the thermally controllable section. The sacrificial layer comprises a sacrificial material outside the thermally insulating region, and a thermally insulating gap or thermally insulating material separating the lower cladding layer and substrate inside the thermally insulating region.

According to a further aspect, there is provided a tuneable laser comprising the waveguide structure of the first aspect.

According to a yet further aspect, there is provided a method of manufacturing a thermally controlled waveguide. A waveguide structure is provided. The waveguide structure comprises, in order: a substrate, a sacrificial layer, a lower cladding layer, a waveguide core layer, and an upper cladding layer. The lower cladding layer, waveguide core layer, and upper cladding layer form the waveguide, the waveguide has a waveguide core. The waveguide structure has a continuous via passing through the upper cladding layer, waveguide core layer, and lower cladding layer and running parallel to the waveguide ridge along the whole length of the thermally controllable section. A wet etch is provided to the sacrificial layer through the via in order to remove material from at least a thermally insulating region in the sacrificial layer extending at least from the via to beyond the waveguide ridge along the whole length of the thermally controllable section, in order to create a gap separating the lower cladding layer and substrate in the thermally insulating region. The wet etch etches material of the sacrificial layer and does not etch materials of the substrate and lower cladding layer.

Further embodiments of the invention are set out in claim 2 et seq.

DETAILED DESCRIPTION

An alternative undercut structure is presented below. This structure overcomes the limitations of the prior art as it provides a more even heating profile. Furthermore, the structure is highly tolerant to variations in the manufacturing process and, in certain embodiments, allows more effective grounding of the waveguide structure than is possible with prior undercuts.

Figure 2A:
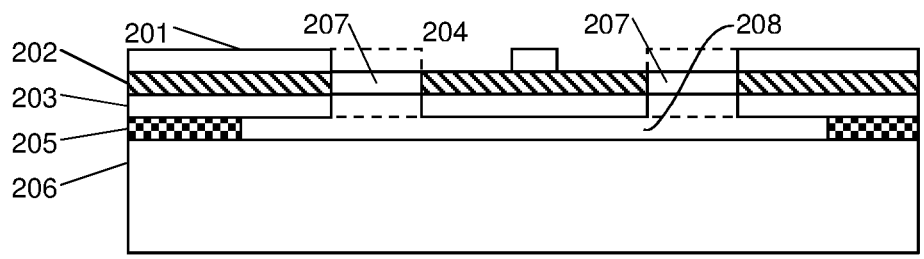
FIGS. 2A and 2B show a cross section and plan view of a known waveguide structure for a thermally tuned laser.
Figure 2B:
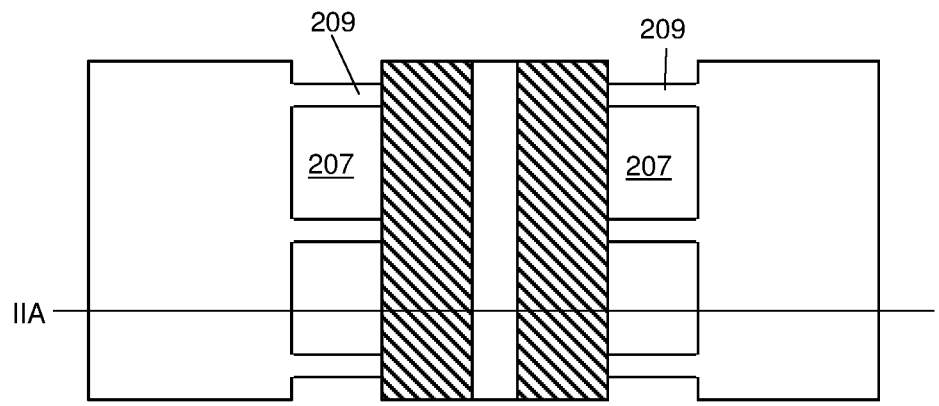
Figure 3A:
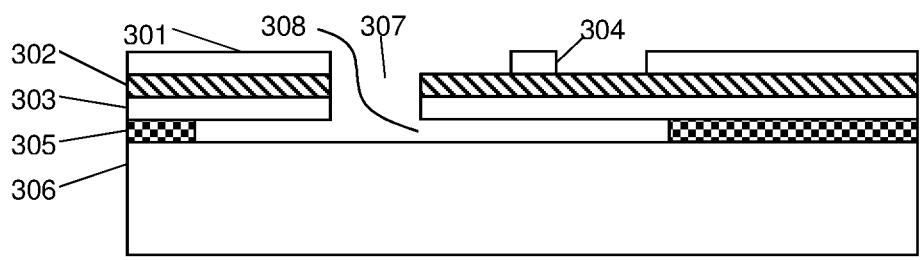
FIG. 3 shows a cross section and plan view of an exemplary waveguide structure for a thermally tuned laser.
Figure 3B:
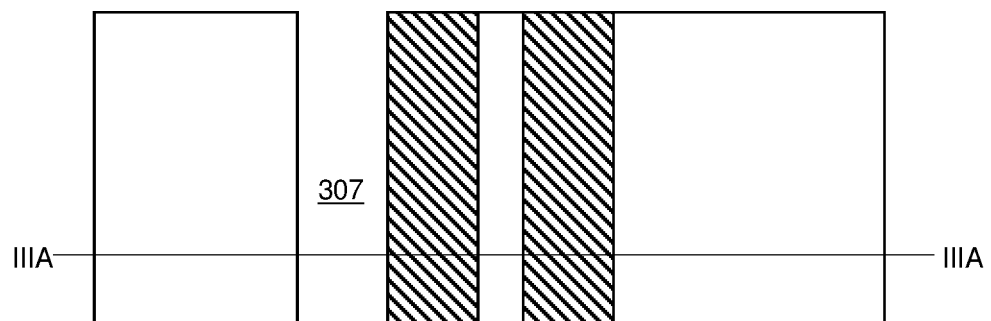

An exemplary structure is shown in FIGS. 3A and 3B, where FIG. 3A is a cross section view of the structure along the line IIIA-IIIA in FIG. 3B, and FIG. 3B is a plan view. Similarly to the prior art structure of FIG. 2, this structure has an upper p-cladding 301 and lower n-cladding 303 sandwiching a waveguide core 302. The upper p-cladding is etched to provide a waveguide ridge 304. A sacrificial layer 305 is provided between the lower n-cladding an a substrate 306. Rather than providing a series of vias on either side of the waveguide, as in known structures, a single via 307 is provided on one side of the waveguide. This via does not have any support structures crossing it and extends through the upper cladding layer 301, waveguide core layer 302 and lower cladding layer 303 as far as the sacrificial layer 305. The via runs parallel to the waveguide ridge along the whole length of the thermally controllable section. Etching fluid is provided into the via to etch the sacrificial layer, which results in the section containing the waveguide ridge overhanging an airgap 308 in a cantilever-like arrangement. Adequate thermal properties can be obtained so long as the sacrificial material is etched at least beyond the waveguide since this will result in the waveguide being thermally insulated from the substrate. Any small over-etch will be uniform along the length of the via and has little effect on the thermal properties of the structure.

Figure 4:
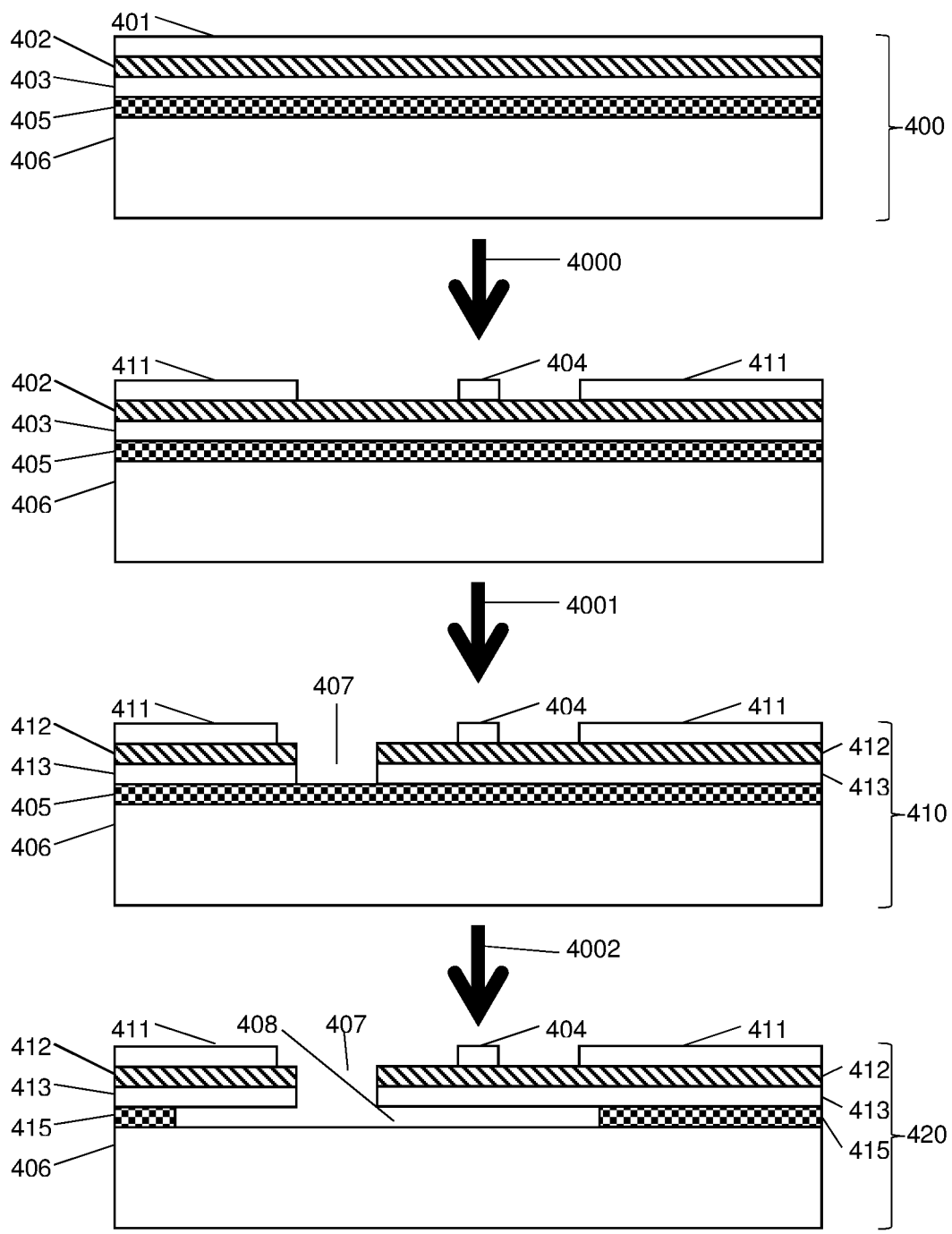
FIG. 4 shows the stages of the manufacture of the structure of FIG. 3.

FIG. 4 shows a manufacturing process for producing the structure of FIG. 3. A layered structure 400 is fabricated, comprising, in order, a substrate layer 406, a sacrificial layer 405, a lower cladding layer 403, a waveguide core layer 402, and an upper cladding layer 401. The upper cladding layer comprises an upper cladding material, e.g. a p-cladding material. The waveguide core layer comprises a waveguide core material. The lower cladding layer comprises a lower cladding material, e.g. an n-cladding material. The sacrificial layer comprises a sacrificial material. The substrate comprises a substrate material.

The layered structure 400 is then etched 4000, 4001 (e.g. using dry etching or a combination of dry etching and wet etching) to create intermediate structure 410. The first etching 4000 etches the upper cladding layer 401 to form a waveguide ridge 404 and an etched upper cladding layer 411. The intermediate structure also has a via 407 which has been etched through waveguide core layer 402, and lower cladding layer 403 to leave etched waveguide core layer 412, and etched lower cladding layer 413. The via passes through the upper cladding layer, waveguide core layer, and lower cladding layer to the sacrificial layer. The upper cladding layer 401 may be etched from the location of the via during etching step 4000 (as shown), or it may be etched together with the waveguide core layer 402 and lower cladding layer 403 during etching step 4001. If the upper cladding layer is only etched during step 4000, then the side of the etched upper cladding layer 411 may not be at the edge of the via (as shown in the figure).

The intermediate structure is then etched 4002 by the use of a chemically selective wet etch introduced to the via 407 to create the waveguide structure 420. The wet etch preferentially etches the sacrificial material to form the etched sacrificial layer 415, such that the sacrificial material is removed from a region extending at least from the via 407 to beyond the waveguide ridge 404, leaving an air gap 408 between the lower cladding layer 413 and the substrate 406 in that region. The air gap causes the region to be thermally insulating. It will be noted that the waveguide structure 420 is equivalent to the waveguide structure presented in FIG. 3.

The etching processes 4001 and 4002 may be performed separately, or an intermediate structure 410 may be created by other means and provided for the wet etching process 4002.

Figure 5:
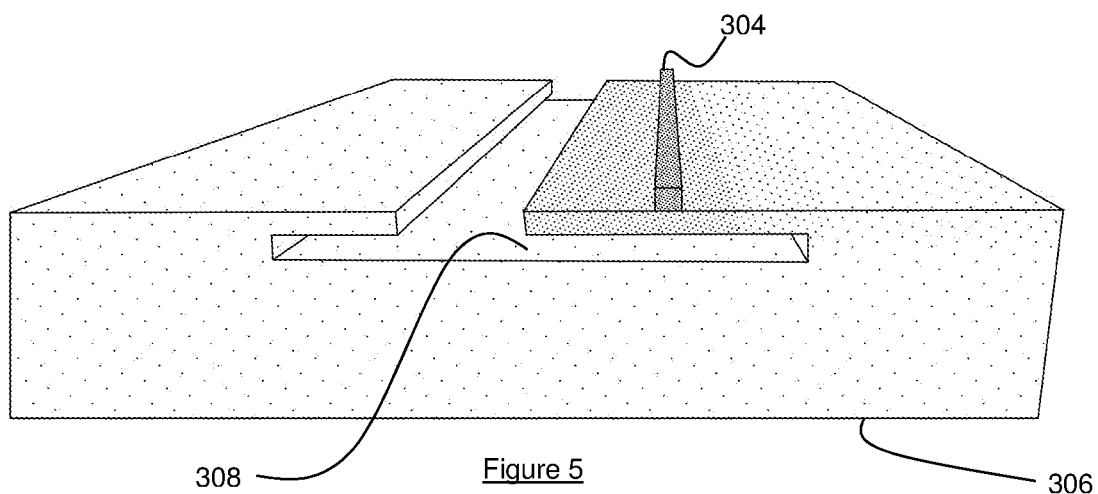
FIG. 5 shows a typical temperature profile of an exemplary waveguide structure during heating.

FIG. 5 shows a thermal model of the structure shown in FIG. 3. Heat is applied to the waveguide ridge 304, and the substrate 306 is held at a constant temperature. In FIG. 3, a high density of dots represents a high temperature, and a low density of dots represents a low temperature. Heat flow via the remaining sacrificial layer can be clearly seen. The thermal properties will depend on the width and thickness of the overhang, the choice of sacrificial material, and the thickness of the sacrificial material.

Typical overhang widths are 20 to 50 microns. Typical sacrificial material thickness is 0.25 to 2 microns. Typical thickness of each of the upper cladding, lower cladding and waveguide core layers is 1-3 microns. The sacrificial material is typically 1-2 microns beneath the optical core. The thermally insulating region typically extends 10-40 microns beyond the waveguide ridge, for example 30 microns beyond the waveguide ridge. In order to avoid thermal effects at the ends of the overhang, the overhang may extend in the direction of the axis of the waveguide at least 20 microns from critical features of the laser such as gratings, at least 50 microns from such features, or at least 100 microns from such features.

The combination of material used for the sacrificial layer, etching fluid, and cladding layers should be selected such that the etching fluid has a strong preference for etching the sacrificial material over the cladding layers. In the case where the waveguide core is vulnerable to the etching fluid, a passivation dielectric may be applied to the exposed surface of the waveguide core within the via, to prevent etching of the waveguide core.

As an example, the sacrificial material used in the sacrificial layer may include one or more of InGaAs, AlInAs, and AlGaInAs, and the cladding layers may include InP. Possible etching fluids which would etch the sacrificial layer but not significantly etch the cladding layer include:

$H_3PO_4$—$H_2O_2$
$H_2SO_4$—$H_2O_2$
citric acid-$H_2O_2$
$HNO_3$
tartaric acid-$HNO_3$
tartaric acid-$H_2O_2$
HF—$H_2O_2$ The sacrificial material in the sacrificial layer remains in place to the sides of the waveguide structure, and may remain in place in regions of the device other than those which are thermally controllable. This ensures that those regions have thermal contact with the substrate, which helps with temperature control of those regions. Instead of leaving an air gap in the etched region, it may be filled or partially filled with a thermally insulating material, i.e. a material which is more thermally insulating than the sacrificial material.

The sacrificial material used in the sacrificial layer may also be formed as more than one discrete layer, although where this is the case, all of these discrete layers still collectively form the sacrificial material. In one arrangement, the sacrificial material may include a lower layer of AlInAs with a top layer of InGaAs. This particular arrangement has a number of advantages. Better growth morphology for subsequent layers appears to be achievable on InGaAs compared to AlInAs, and processing schemes involving a combination of wet etch and dry etch procedures can advantageously be employed. The combination of materials allows for optimisation of thermal conductivity in the layer remaining under the gain section. The optical absorption due to InGaAs helps to control stray (unguided) light. As an alternative, only InGaAs may be used as the sacrificial layer.

Figure 6:
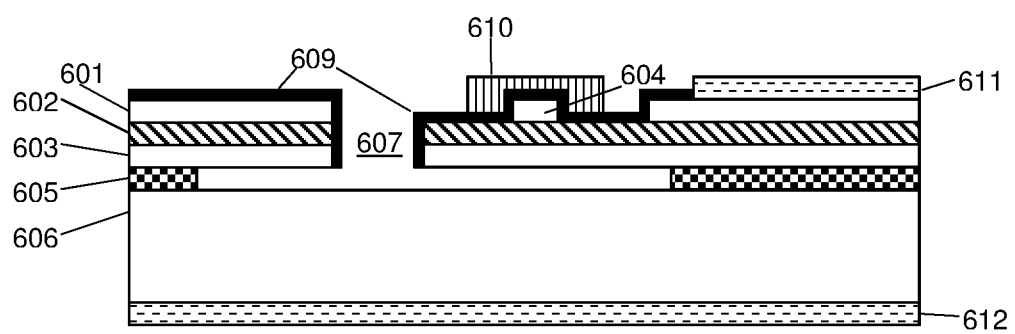
FIG. 6 shows a cross section of an exemplary thermally tuned laser.

FIG. 6 shows an exemplary structure with further components. The upper and lower cladding 601, 603, waveguide core layer 602, waveguide ridge 604, sacrificial layer 605, via 607 and substrate 606 are equivalent to those of the structure in FIG. 3. The structure further comprises a passivation dielectric 609, a heater resistor 610, and ground contacts 611, 612. The passivation dielectric 609 shields the waveguide core from the wet etch, and electrically isolates the ridge waveguide from the heater resistor 610. The passivation dielectric may be arranged to perform one or both of these functions. Referring back to FIG. 4, the passivation dielectric may be applied to the intermediate structure 410 prior to introduction of the wet etch 4002. The heater resistor 610 provides heating to the ridge waveguide as required for thermal tuning of the laser. The ground contacts 611, 612 cause a reduction in carrier density oscillations in the waveguide core and clamping of the Fermi level, which results in a suppression of shot noise and improved performance particularly in the 10 MHz-100 MHz range. Because the p ground contact 611 is better connected to the waveguide ridge than is possible in prior art undercut designs, the shot noise of the structure shown is significantly reduced compared to an equivalent structure based on that shown in FIG. 2. Other configurations of ground contacts and heaters are possible. For example, there may be a ground contact on the top of the waveguide ridge, with heaters on either side of the ridge, or a ground contact within one or both gaps in the upper cladding layer next to the ridge. The heater(s) may be in contact with the top of the ridge, the sides of the ridge, or both.

Figure 7:
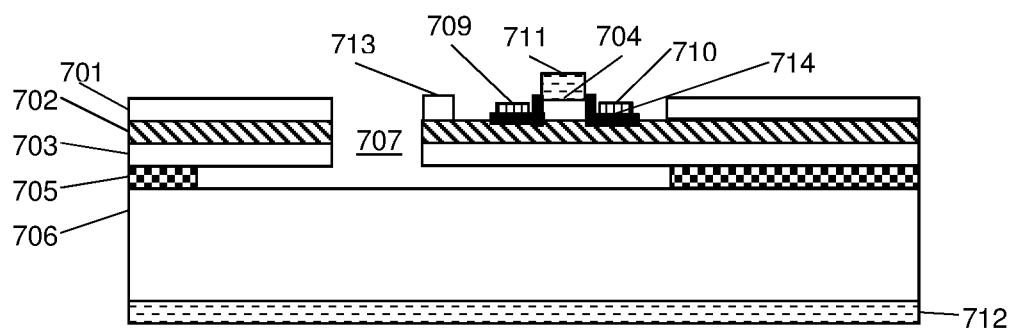
FIG. 7 shows a cross section of an alternative exemplary thermally tuned laser.

FIG. 7 shows an alternative exemplary structure. The upper and lower cladding 701, 703, waveguide core layer 702, waveguide ridge 704, sacrificial layer 705, via 707 and substrate 706 are equivalent to those of the structure in FIG. 3. The structure further comprises heater resistors 709, 710, ground contacts 711, 712, and a support ridge 713. The ground contact 711 is located on top of the waveguide ridge 704, and the heaters 709, 710 are located equidistant to either side of the ridge. A passivation dielectric 714 is provided to prevent electrical contact between the heaters and the semiconductor. The passivation dielectric 714 has a gap to allow contact between the ground contact 711 and the waveguide ridge 704. This arrangement provides improved phase noise relative to the arrangement of FIG. 6. The support ridge 713 improves the mechanical strength of the overhang, in a manner analogous to a "C-beam" or "parallel flange channel" as used in mechanical fields. The upper cladding 701 of the support ridge 713 may be thickened to increase the mechanical integrity.

The additional features of FIG. 6 and FIG. 7 may be combined in any suitable arrangement, or with other features mentioned in the disclosure but not presented in the figures. For example, a structure may be provided with the arrangement of ground contacts 611, 612 and the support ridge 713, or with the arrangement of heater resistors 709, 710 and ground contact 712, without a support ridge 713.

Figure 1A:
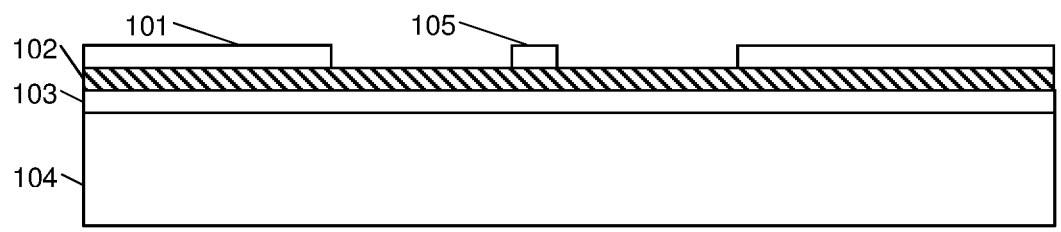
FIG. 1 shows a cross section of a waveguide structure of a typical electrically tuned laser.
Figure 1B:
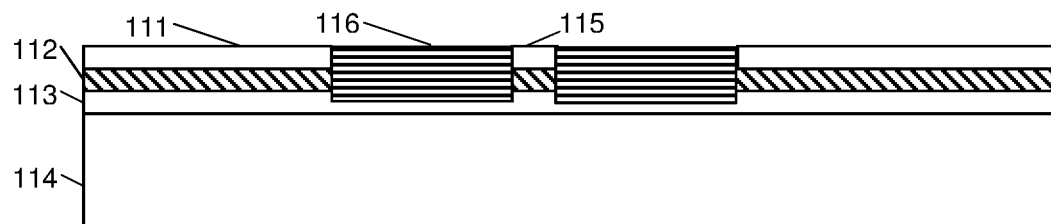
Figure 8:
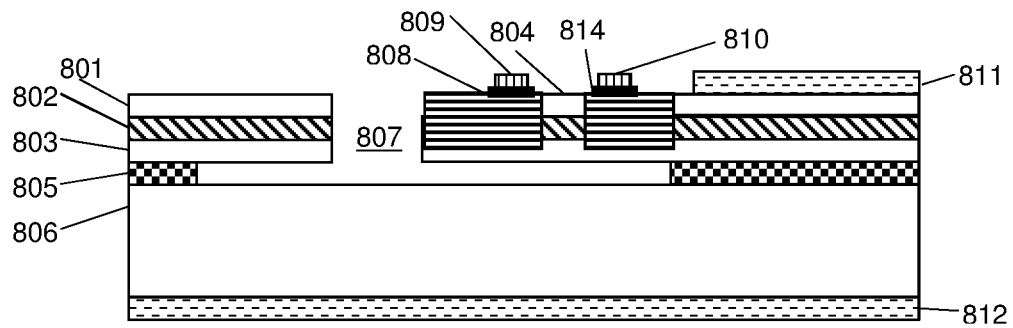
FIG. 8 shows a cross section of an exemplary buried heterostructure laser.

A similar thermal isolation structure may be applied to a buried heterostructure laser, as shown in FIG. 8. FIG. 8 shows a waveguide structure comprising an upper and lower cladding 801, 803, waveguide core layer 802, waveguide 804, isolating regions 808, sacrificial layer 805, via 807 and substrate 806. The substrate 806, via 807, and sacrificial layer 805 are equivalent to those of FIGS. 6 and 7. The waveguide 804 and isolating regions 808 are equivalent to the structure 115 and isolating regions 116 of FIG. 1B. Ground contacts 811, 812 are shown in a corresponding arrangement to that of FIG. 6, but may also be in an arrangement equivalent to that of FIG. 7. Heaters may be applied to any suitable location around the waveguide structure 804, e.g. either side of the waveguide structure as shown for heaters 809, 810. A passivation dielectric is applied to prevent electrical contact between the heaters 814 and the underlying components. In order to provide sufficient thermal isolation, the undercut should extend at least beyond the waveguide core, i.e. beyond the waveguide structure 804.

The waveguide structure disclosed above may be used for any waveguide with a thermally controllable section. For example, in a Distributed Bragg Reflector (DBR) laser, the waveguide structure may be used for the rear DBR section and/or the phase control section to provide improved thermal control of those sections.

The invention claimed is:

1. A waveguide structure including a waveguide having a thermally controllable section and including a plurality of layers and a ground contact,
   wherein
     the plurality of layers include, in order:
       a substrate,
       a sacrificial layer,
       a lower cladding layer,
       a waveguide core layer, and an upper cladding layer;
the lower cladding layer, the waveguide core layer, and the upper cladding layer form the waveguide,
the waveguide includes a waveguide core;
the waveguide structure has a continuous via passing through the upper cladding layer, the waveguide core layer, and the lower cladding layer and running parallel to the waveguide core along substantially an entire length of the thermally controllable section on only one side of a ridge of the waveguide;
the sacrificial layer includes a thermally insulating region extending at least from the via to beyond the waveguide core along the entire length of the thermally controllable section,
the sacrificial layer includes a sacrificial material outside the thermally insulating region,
a thermally insulating gap or thermally insulating material separates the lower cladding layer and substrate inside the thermally insulating region; and
the ground contact is in electrical contact with the upper cladding layer on the opposite side of the waveguide core to the via; or
the ground contact is in electrical contact with the upper cladding layer adjacent to the waveguide core.

2. The waveguide structure according to claim 1, wherein the thermally insulating region extends from the via to at least 5 microns beyond the waveguide core.

3. The waveguide structure according to claim 1, further comprising:
a passivation dielectric applied to an exposed surface of the waveguide core layer.

4. The waveguide structure according to claim 1, further comprising:
a heater in thermal contact with the upper cladding layer adjacent to the waveguide core.

5. The waveguide structure according to claim 4, further comprising:
a passivation dielectric applied between the upper cladding layer and the heater,
wherein the passivation dielectric is configured to electrically insulate the ridge of the waveguide from the heater.

6. The waveguide structure according to claim 4, wherein the heater is a heater resistor.

7. The waveguide structure according to claim 1, further comprising:
a first heater located on first side of the waveguide core; and
a second heater located on second side of the waveguide core.

8. The waveguide structure according to claim 1, wherein a thickness of the sacrificial layer is between 0.5 microns and 2 microns.

9. The waveguide structure according to claim 1, wherein a width of the thermally insulating region is 20 microns to 40 microns, and
the width is measured in a direction perpendicular to the waveguide core and in a plane of the sacrificial layer.

10. The waveguide structure according to claim 1, wherein the sacrificial material includes at least one of:
indium gallium arsenide (InGaAs),
aluminium indium arsenide (AlInAs), or
aluminium gallium indium arsenide (AlGaInAs).

11. The waveguide structure according to claim 1, wherein the sacrificial material includes a lower layer of AlInAs and a top layer of InGaAs.

12. The waveguide structure according to claim 1, wherein the upper cladding layer includes a waveguide ridge located adjacent to the waveguide core.

13. The waveguide structure according to claim 12, further comprising:
a support ridge, located between the waveguide ridge and the via, running parallel to the waveguide ridge along substantially the entire length of the thermally controllable section.

14. The waveguide structure according to claim 1, wherein
the upper cladding layer and waveguide core layer comprise a waveguide, and
the waveguide structure further includes:
isolating regions on either side of the waveguide that insulate the waveguide from other parts of the upper cladding layer and waveguide core layer.

15. A tuneable laser comprising the waveguide structure of claim 1.

16. The laser according to claim 15, wherein the thermally controllable section of the waveguide forms part of a Distributed Bragg reflector.

17. The laser according to claim 15, where the thermally controllable section of the waveguide forms part of a phase controller in a laser cavity.

18. A method of manufacturing a waveguide, the method comprising:
providing a waveguide structure including a plurality of layers and a ground contact, the plurality of layers including, in order:
a substrate,
a sacrificial layer,
a lower cladding layer,
a waveguide core layer, and
an upper cladding layer;
wherein:
the lower cladding layer, the waveguide core layer, and the upper cladding layer form the waveguide,
the waveguide has a waveguide core,
the waveguide structure has a continuous via passing through the upper cladding layer, the waveguide core layer, and the lower cladding layer and running parallel to a ridge of the waveguide along an entire length of a thermally controllable section of the waveguide on only one side of the ridge of the waveguide, and
the waveguide structure is arranged such that:
the ground contact is in electrical contact with the upper cladding layer on the opposite side of the waveguide core to the via; or
the ground contact is in electrical contact with the upper cladding layer adjacent to the waveguide core; and
providing a wet etch to the sacrificial layer through the via in order to:
remove material from at least a thermally insulating region in the sacrificial layer extending at least from the via to beyond the ridge of the waveguide along the entire length of the thermally controllable section, and
create a gap separating the lower cladding layer and substrate in the thermally insulating region, wherein the wet etch etches material of the sacrificial layer and does not etch materials of the substrate and lower cladding layer.

19. The method according to claim 18, wherein the waveguide structure further includes a passivation dielectric applied to an exposed surface of the waveguide core layer.

20. The method according to claim 18, wherein a fluid for providing the wet etch is at least one of:
$H_3PO_4$—$H_2O_2$,
$H_2SO_4$—$H_2O_2$,
citric acid-$H_2O_2$,
$HNO_3$,
tartaric acid-$HNO_3$,
tartaric acid-$H_2O_2$, or
HF—$H_2O_2$.

21. The method according to claim 18, wherein the sacrificial layer includes at least one of:
indium gallium arsenide (InGaAs),
aluminium indium arsenide (AlInAs), or
aluminium gallium indium arsenide (AlGaInAs).

22. The method according to claim 18, wherein the sacrificial layer includes a layer of AlInAs and a layer of InGaAs.

23. The method according to claim 18, wherein providing the waveguide structure includes:
etching the upper cladding layer to form a waveguide ridge; and
etching the upper cladding layer, the waveguide core layer, and the lower cladding layer to form the via.

24. The method according to claim 23, wherein etching the upper cladding layer and etching the upper cladding layer, the waveguide core layer, and the lower cladding layer includes dry etching or a combination of dry and wet etching.

25. The method according to claim 23, further comprising:
fabricating, prior to etching the upper cladding layer and etching the upper cladding layer, the waveguide core layer, and the lower cladding layer, and a layered structure.

* * * * *